United States Patent
Ito et al.

(10) Patent No.: US 9,299,729 B2
(45) Date of Patent: Mar. 29, 2016

(54) ELECTRO-OPTICAL DEVICE, PROJECTION-TYPE DISPLAY DEVICE, AND ELECTRONIC APPARATUS

(75) Inventors: Satoshi Ito, Eniwa (JP); Yoshitake Tateno, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 124 days.

(21) Appl. No.: 13/430,960

(22) Filed: Mar. 27, 2012

(65) Prior Publication Data
US 2012/0249905 A1 Oct. 4, 2012

(30) Foreign Application Priority Data
Apr. 1, 2011 (JP) ................................. 2011-081642

(51) Int. Cl.
*G02F 1/1362* (2006.01)
*H01L 27/12* (2006.01)
*H01L 49/02* (2006.01)

(52) U.S. Cl.
CPC ...... *H01L 27/1255* (2013.01); *G02F 1/136213* (2013.01); *G02F 2001/13629* (2013.01); *H01L 28/60* (2013.01)

(58) Field of Classification Search
CPC .................. G02F 1/136213; G02F 2001/13629
USPC .......................................................... 349/38
See application file for complete search history.

(56) References Cited

U.S. PATENT DOCUMENTS

| 5,317,433 A | 5/1994 | Miyawaki et al. |
| 5,633,182 A | 5/1997 | Miyawaki et al. |
| 2004/0135952 A1* | 7/2004 | Kurashina et al. ............ 349/139 |
| 2004/0145541 A1* | 7/2004 | Iki et al. .......................... 345/44 |
| 2005/0088596 A1* | 4/2005 | Shimizu et al. ............... 349/139 |
| 2006/0220033 A1* | 10/2006 | Yamasaki ....................... 257/79 |
| 2008/0186423 A1* | 8/2008 | Ishii ................................ 349/46 |
| 2009/0040447 A1* | 2/2009 | Nakagawa .................... 349/139 |
| 2009/0068773 A1* | 3/2009 | Lai et al. ......................... 438/23 |
| 2010/0171131 A1 | 7/2010 | Iki |
| 2010/0188591 A1* | 7/2010 | Oikawa .......................... 349/39 |

FOREIGN PATENT DOCUMENTS

| EP | 1037093 | 9/2000 |
| JP | 5-257171 A | 10/1993 |
| JP | 2000-137246 A | 5/2000 |
| JP | 2003-316294 A | 11/2003 |
| JP | 2007-3903 A | 1/2007 |
| JP | 2010-96966 A | 4/2010 |
| JP | 2010-176119 A | 8/2010 |

* cited by examiner

*Primary Examiner* — Michael Caley
*Assistant Examiner* — Edmond Lau
(74) *Attorney, Agent, or Firm* — ALG Intellectual Property, LLC

(57) ABSTRACT

An electro-optical device includes a substrate; a translucent pixel electrode installed at one side of the substrate; and a storage capacitor which is installed between the pixel electrode and the substrate, and in which a translucent first electrode layer overlapping with the pixel electrode in a plane view, a translucent second electrode layer electrically connected to the pixel electrode, and a translucent dielectric layer interposed between the first electrode layer and the second electrode layer are laminated.

18 Claims, 8 Drawing Sheets

ELECTRO-OPTICAL DEVICE, PROJECTION-TYPE DISPLAY DEVICE, AND ELECTRONIC APPARATUS

BACKGROUND

1. Technical Field

The present invention relates to an electro-optical device, and a projection-type display device and an electronic apparatus having the electro-optical device, in which a storage capacitor is installed to an element substrate.

2. Related Art

In an active matrix-type electro-optical device such as a liquid crystal device or an organic electroluminescence device, pixels having a pixel transistor and a translucent pixel electrode are disposed in a matrix shape, and an image signal is supplied to the pixel transistor by using the time when the pixel transistor is turned on by the scanning signal through the scanning line. In addition, in the electro-optical device, by providing a storage capacitor to each pixel, it is designed to promote higher contrast in a displayed image. At this time, since an electrode of the storage capacitor is formed from a light blocking material such as a metallic film, so as not to disturb the output of display light from the pixels, a region is provided which overlaps in a plane view in an interpixel region which is interposed by adjacent pixel electrodes (see JP-A-2010-96966).

However, in the electro-optical device, in a case where reducing the pixel pitch or decreasing the pixel size is attempted for the purpose of forming a more precise image or the like, in a state of the configuration disclosed in JP-A-2010-96966, a sufficient area to form a storage capacitor cannot be ensured, and a storage capacitor with sufficient capacity cannot be configured. Particularly, among liquid crystal devices, in a transmission-type liquid crystal device or a bottom emission-type organic electroluminescence device which outputs a display light from a substrate body, since a storage capacitor must be provided at a location not disturbing the output of a display light, the above problems are remarkable.

Here, as schematically shown in FIG. 9, there is proposed a liquid crystal device which has a translucent dielectric layer 40 and a translucent electrode 7w at a region overlapping with a translucent pixel electrode 9a in a plane view and applies a common potential to the electrode 7w and a common electrode 21 of an opposite substrate 20 side (see JP-A-2010-176119). In the corresponding liquid crystal device, since the storage capacitor 55w is configured by a translucent pixel electrode 9a, a translucent dielectric layer 40, and a translucent electrode 7w, even though a region where a storage capacitor 55w is formed is extended the output of a display light is not disturbed.

In the configuration disclosed in JP-A-2010-176119, the orientation of the liquid crystal layer 50 near the end portion of the pixel electrode 9a cannot be suitably controlled, and the precision of the image is deteriorated. In more detail, in the liquid crystal device, the orientation of liquid crystal molecules is controlled by a vertical electric field (electric field indicated by the arrow V1) generated between the pixel electrode 9a of the element substrate 10 side and a common electrode 21 of the opposite substrate 20 side to which a common potential is applied. However, in the configuration disclosed in JP-A-2010-176119, in the region overlapping with an inter-pixel region 10f interposed between adjacent pixel electrode 9a, only a dielectric layer 40 is present at an upper layer of the electrode 7w to which a common potential is applied. For this reason, an unnecessary electric field (electric field indicated by the arrow V2) passing through the liquid crystal layer 50 is generated between the pixel electrode 9a and the electrode 7w. For this reason, in the liquid crystal layer 50, the potential distribution is disarrayed near the end portion of the pixel electrode 9a, and so the orientation of the liquid crystal molecules is in disarray.

SUMMARY

An advantage of some aspects of the invention is to provide an electro-optical device in which the output light quantity of a display light is not easily deteriorated and the potential distribution is not easily disarrayed near the end portion of a pixel electrode even though the formation region of the storage capacitor is spread; and a projection-type display device and an electronic apparatus having the electro-optical device.

According to an aspect of the invention, there is provided an electro-optical device, which includes a substrate; a translucent pixel electrode installed at one side of the substrate; and a storage capacitor which is installed between the pixel electrode and the substrate, and in which a translucent first electrode layer overlapping with the pixel electrode in a plane view, a translucent second electrode layer electrically connected to the pixel electrode, and a translucent dielectric layer interposed between the first electrode layer and the second electrode layer are laminated.

In the aspect of the invention, since the storage capacitor is configured by using the translucent first electrode layer, the translucent dielectric layer, and the translucent second electrode layer, even though the formation region of the storage capacitor is spread to increase the capacity value of the storage capacitor, the output light quantity of the display light is not disturbed. In addition, in the invention, since two translucent electrodes (a first electrode layer and a second electrode layer) other than the pixel electrode are used, the translucent interlayer insulating film may be provided between the storage capacitor and the pixel electrode. Therefore, even in the case where the first electrode layer is present in the region overlapping the space between adjacent pixel electrodes (the inter-pixel region) in a plane view, at least the interlayer insulating film is interposed between the first electrode layer and the pixel electrode, and so it is advantageously difficult for an unnecessary electric field to be generated between the end portion of the pixel electrode and the first electrode layer.

In the aspect of the invention, the first electrode layer may have an opening in a region overlapping the space between adjacent pixel electrodes, and in a region overlapping with the opening in a plane view, a first relay electrode electrically connecting the pixel electrode and the second electrode layer may be installed. According to this configuration, even in the case where the first electrode layer is formed over a wide range, electric connection may be made to the pixel electrode. In addition, since the opening formed in the region overlapping the space between adjacent pixel electrodes is used, electric connection may be made to the pixel electrode without greatly reducing the region where the display light may be output.

In the aspect of the invention, the first relay electrode may include an extended portion in a first direction in a region overlapping the space between adjacent pixel electrodes in a plane view, and a curved portion curved from the extended portion in a second direction crossing the first direction and curved in a second direction, a first contact hole for electrically connecting the first relay electrode and the second electrode layer may be installed in a region overlapping with the extended portion, and a second contact hole for electrically connecting the first relay electrode and the pixel electrode may be installed in a region overlapping with the curved portion. According to this configuration, since the first relay electrode formed in the region overlapping the space between adjacent pixel electrodes is used, electric connection may be made to the pixel electrode without greatly reducing the region where the display light may be output.

In the aspect of the invention, a transistor installed to correspond to the pixel electrode and a second relay electrode for electrically connecting the transistor and the first relay electrode may be further provided; the second relay electrode may be disposed to overlap with the transistor in a plane view and disposed to extend in the first direction in the region overlapping the space between adjacent pixel electrodes; the first relay electrode may include, in a plane view, an overlapping portion extending in the first direction in the region overlapping the space between adjacent pixel electrodes to overlap with the second relay electrode in a plane view, and a protruding portion protruding in the first direction from the end of the second relay electrode in the region overlapping the space between adjacent pixel electrodes in a plane view; the second electrode layer may be electrically connected to the overlapping portion through the first contact hole; and the pixel electrode may be electrically connected to the protruding portion through the second contact hole. According to this configuration, since the first relay electrode and the second relay electrode formed in the region overlapping the space between adjacent pixel electrodes are used, electric connection may be made to the pixel electrode without greatly reducing the region where the display light may be output.

In the aspect of the invention, the first electrode layer may be installed to the dielectric layer at the substrate side, and the second electrode layer may be installed to the dielectric layer at the pixel electrode side. According to this configuration, the dielectric layer is also interposed between the first electrode layer and the pixel electrode together with the interlayer insulating film. Therefore, it is possible to prevent an unnecessary electric field from being generated between the end portion of the pixel electrode and the first electrode layer. In addition, in the first electrode layer, the pixel electrode and the second electrode layer to which a pixel potential is applied are present at only one side, and the pixel electrode and the second electrode layer are not present at the substrate side of the first electrode layer. Therefore, since the unnecessary capacity is not parasitic between the pixel electrode, the second electrode layer and the data line or the like, a driving loss is not generated. Therefore, it is possible to reduce power consumption.

In the aspect of the invention, the first electrode layer may be installed to the dielectric layer at the pixel electrode side, and the second electrode layer may be installed to the dielectric layer at the substrate side. Even in this configuration, since the interlayer insulating film may be interposed between the first electrode layer and the pixel electrode, it is possible to prevent an unnecessary electric field from being generated between the end portion of the pixel electrode and the first electrode layer.

In the aspect of the invention, the surface of an interlayer insulating film installed between the storage capacitor and the pixel electrode preferably may have a flat side. According to this configuration, the thickness of the interlayer insulating film increases by the thickness of the second electrode layer in comparison to the region overlapping with the second electrode layer. Therefore, it is advantageously difficult for an unnecessary electric field to be generated between the first electrode layer and the pixel electrode.

In the aspect of the invention, the first electrode layer may be installed at the entire surface of a pixel arrangement region where a plurality of the pixel electrodes is arranged. In the aspect of the invention, since it is difficult for an unnecessary electric field to be generated between the first electrode layer and the pixel electrode, even though the area where the first electrode layer is located is increased between adjacent pixel electrodes (the inter-pixel region) by forming the first electrode layer over a wide range, the influence of an unnecessary electric field may not be generated.

In the aspect of the invention, a light-shielding layer may be installed in the region overlapping the space between adjacent pixel electrodes in a plane view, and the storage capacitor may be at least installed within the region overlapping a translucent region surrounded by the light-shielding layer in a plane view. In the case where the light-shielding layer is installed in the region overlapping with the inter-pixel region in a plane view, since the translucent region may be easily narrowed, great effects may be obtained when the invention is applied.

In the case where an electro-optical device according to the aspect of the invention is configured using the liquid crystal device, the substrate may retain a liquid crystal layer between the substrate and a translucent opposite substrate oppositely disposed at one surface side of the substrate.

The electro-optical device according to the aspect of the invention may be used as various display devices such as a direct-display device of various kinds of electronic apparatuses. In addition, in the case where the electro-optical device according to the aspect of the invention is the liquid crystal device, the electro-optical device (liquid crystal device) may be used for a projection-type display device. The projection-type display device includes a light source unit for outputting the illumination light radiated to the electro-optical device (liquid crystal device) and an optical projecting system for projecting the light modulated by the liquid crystal device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Referring to the figures, embodiments of the invention will be described. The invention will be described based on the case where it is applied to a liquid crystal device, among various electro-optical devices. In addition, in regard to the figures referred to in the following description, the scale of each layer or member may be changed so that each layer or member may be so increased to be recognizable on the figures. In addition, in the case where the direction of current flowing through a pixel transistor reverses, the source and the drain are exchanged. However, in this description, the side connected to the pixel electrode (a source drain region at a pixel side) is used as the drain, and the side connected to a data line (a source drain region at a data line side) is used as the source. In addition, when a layer formed on an element substrate is described, an upper layer side or a surface side means a side opposite to a substrate body of the element substrate (a side where an opposite substrate is located), and a lower side means a side where the substrate body of the element substrate is located. In addition, in the following description, common parts will have with the same reference symbol applied thereto so that the correspondence of configurations may be easily understood with reference to FIG. 8.

First Embodiment

Overall Configuration

Figure 1:
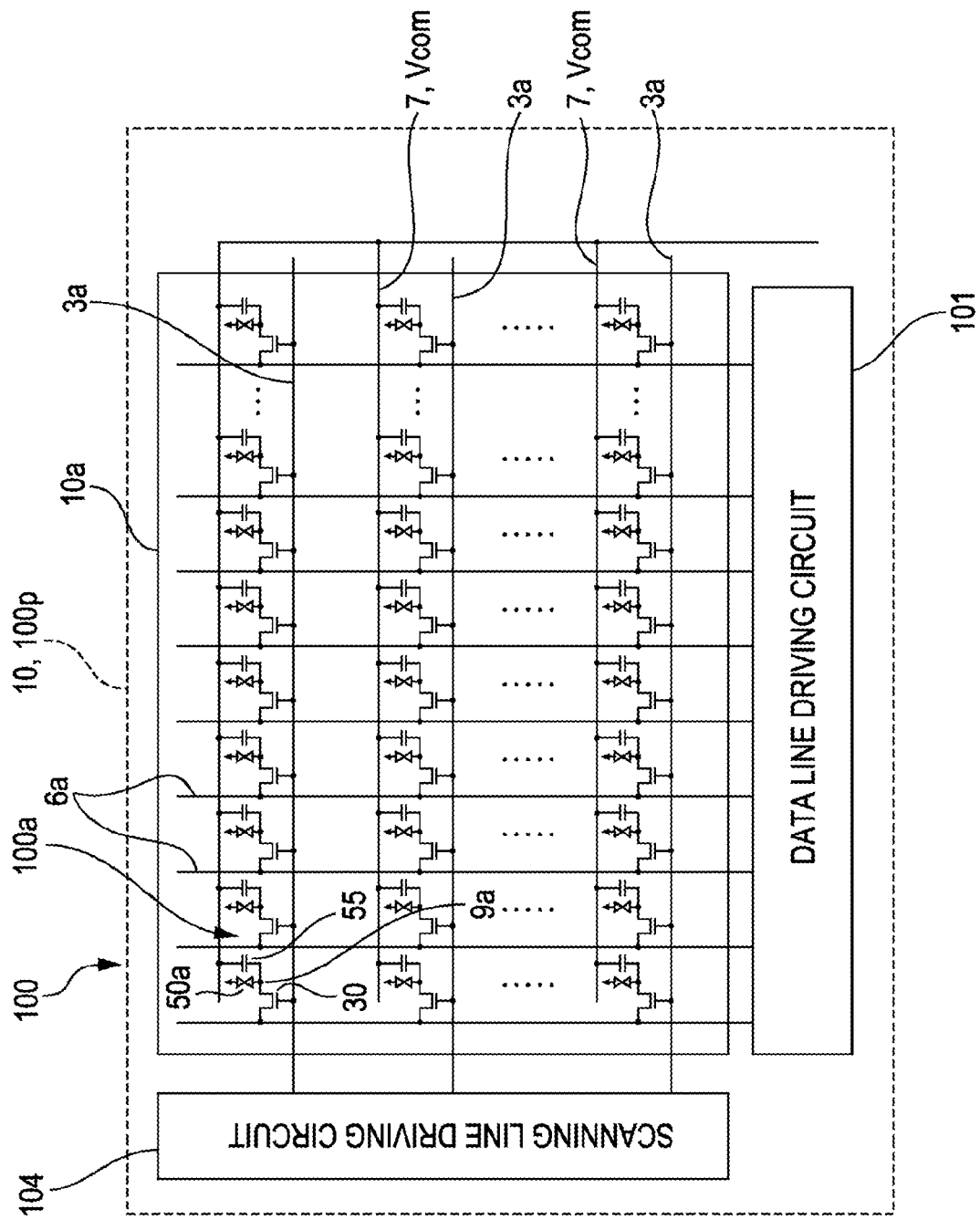
FIG. 1 is a block diagram showing an electric configuration of a liquid crystal device (electro-optical device) according to the invention.

FIG. 1 is a block diagram showing an electric configuration of a liquid crystal device (electro-optical device) according to the invention. FIG. 1 is a block diagram showing an electric configuration, and does not show shapes, extending directions, layouts or the like of wires or electrodes.

In FIG. 1, a liquid crystal device 100 (electro-optical device) of this embodiment has a liquid crystal panel 100*p* if a TN (Twisted Nematic) mode or a VA (Vertical Alignment) mode, and the liquid crystal panel 100*p* has an image display region 10*a* (pixel arrangement region), where a plurality of pixels 100*a* are arranged in a matrix shape, at its central region. In the liquid crystal panel 100*p*, at an element substrate 10 (see FIGS. 2A and 2B or the like) described later, a plurality of data lines 6*a* and a plurality of scanning lines 3*a* extend in the vertical and horizontal directions at the inside of the image display region 10*a*, and the pixels 100*a* are provided at locations corresponding to their crossing points. At each of the plurality of pixels 100*a*, a pixel transistor 30 made of an electric field effect-type transistor and a pixel electrode 9*a* described later are formed. The data line 6*a* is electrically connected to the source of the pixel transistor 30, and the scanning line 3*a* is electrically connected to the gate of the pixel transistor 30, the pixel electrode 9*a* is electrically connected to the drain of the pixel transistor 30.

In the element substrate 10, a scanning line driving circuit 104 or a data line driving circuit 101 is installed at the outer circumference than the image display region 10*a*. The data line driving circuit 101 is electrically connected to each data line 6*a* and thus supplies image signals, fed from an image processing circuit, to each data line 6*a* in order. The scanning line driving circuit 104 is electrically connected to each scanning line 3*a* and supplies scanning signals to each scanning line 3*a* in order.

In each pixel 100*a*, the pixel electrode 9*a* is opposite to a common electrode formed at an opposite substrate 20 (see FIGS. 2A and 2B or the like), described later, via the liquid crystal layer to configure a liquid crystal capacitor 50*a*. In addition, at each pixel 100*a*, in order to prevent image signal retained by the liquid crystal capacitor 50*a* from changing, a storage capacitor 55 is added in parallel to the liquid crystal capacitor 50*a*. In this embodiment, in order to configure the storage capacitor 55, a first electrode layer 7 formed over the plurality of pixels 100*a* is formed as a capacitor electrode layer. In this embodiment, a common potential Vcom is applied to the first electrode layer 7.

Configuration of the Liquid Crystal Panel 100*p*

Figure 2A:
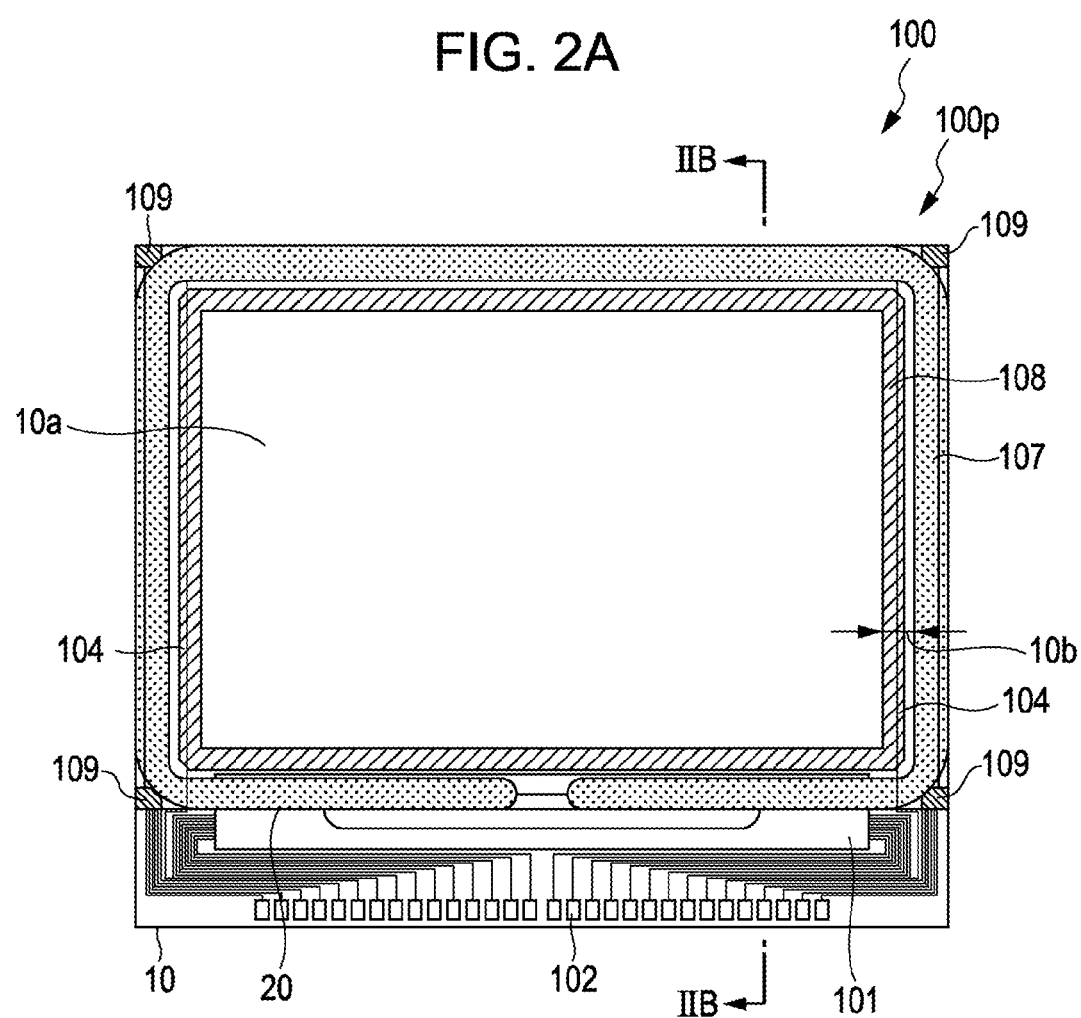
FIGS. 2A and 2B are diagrams for illustrating a liquid crystal panel used for the liquid crystal device according to the invention.
Figure 2B:
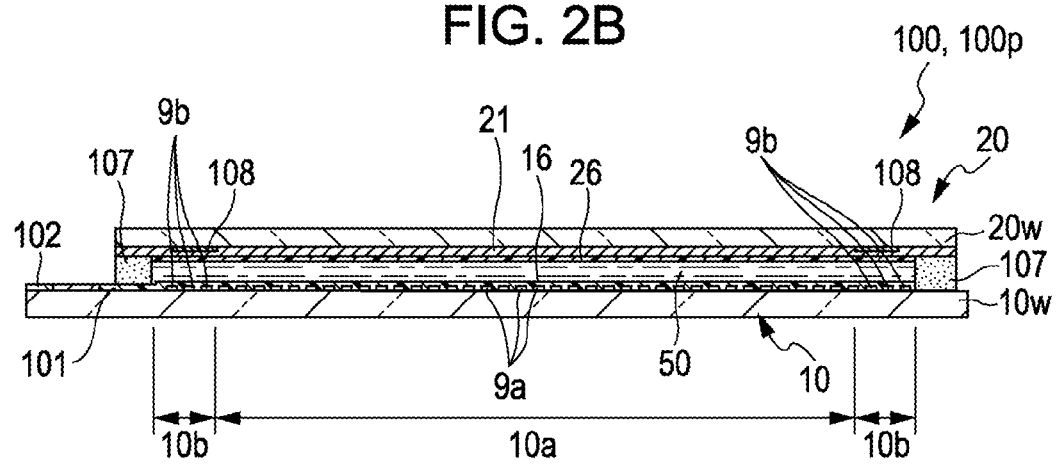

FIGS. 2A and 2B are diagrams for illustrating a liquid crystal panel 100*p* used for the liquid crystal device 100 according to the invention, and FIGS. 2A and 2B are respectively a plane view showing the liquid crystal panel 100*p* together with every component at its side, and a cross-sectional view thereof along IIB-IIB.

As shown in FIGS. 2A and 2B, in the liquid crystal panel 100*p*, the element substrate 10 (an element substrate for the electro-optical device/an element substrate for the liquid crystal device) and the opposite substrate 20 are attached and adhered by means of a sealant 107 through a predetermined gap, and the sealant 107 is installed in a frame shape according to the outer frame of the opposite substrate 20. The sealant 107 is an adhesive made of a photo-curable resin or thermosetting resin, and is mixed with a gap material such as glass fiber or glass beads to ensure a predetermined distance between both substrates.

In the liquid crystal panel 100*p* configured as above, both the element substrate 10 and the opposite substrate 20 have rectangular shapes, and at the approximate center of the liquid crystal panel 100*p*, the image display region 10*a* (pixel arrangement region) described with reference to FIG. 1 is installed as a rectangular region. Corresponding to the above shape, the sealant 107 is also installed with an approximately rectangular shape, and between the inner circumference of the sealant 107 and the outer circumference of the image display region 10*a*, a surrounding region 10*b* having an approximately rectangular shape is installed with a frame shape. In regard to the element substrate 10, at the outer side of the image display region 10*a*, a data line driving circuit 101 and a plurality of terminals 102 are formed along one side of the element substrate 10, and a scanning line driving circuit 104 is formed along another side adjacent to the side. Moreover, a flexible wiring substrate (not shown) is connected to the terminal 102, and various potentials or various signals are input to the element substrate 10 via the flexible wiring substrate.

Though being described later in more detail, at one surface 10*s* between one surface 10*s* and the other surface 10*t* of the element substrate 10, the pixel transistor 30 described with reference to FIG. 1 and the pixel electrode 9*a* electrically connected to the pixel transistor 30 are formed with a matrix shape at the image display region 10*a*, and an orientation film 16 is formed at the upper layer side of the corresponding pixel electrode 9*a*.

In addition, in one surface 10*s* of the element substrate 10, a dummy pixel electrode 9*b* (see FIG. 2B) simultaneously formed with pixel electrode 9*a* is formed at the surrounding region 10*b*. In regard to the dummy pixel electrode 9*b*, a configuration of being electrically connected to a pixel transistor of the dummy, a configuration of being directly electrically connected to a wiring without installing the pixel transistor of the pixel, or a configuration of being in a floating state to which a potential is not applied may be adopted. The corresponding dummy pixel electrode 9b compresses height locations of the image display region 10a and surrounding region 10b when the surface of the element substrate 10 where the orientation film 16 is formed is flattened, thereby contributing to making the surface where the orientation film 16 is formed into a flat side. In addition, if the dummy pixel electrode 9b is set to have a potential, it is possible to prevent the orientation of liquid crystal molecules from being disarrayed from the outer circumferential end of the image display region 10a.

A common electrode 21 is formed at the surface of the opposite substrate 20 which faces the element substrate 10, and an orientation film 26 is formed at the upper layer of the common electrode 21. Since the common electrode 21 is formed on approximately the entire surface of the opposite substrate 20 or over a plurality of pixels 100a as a plurality of strip-type electrodes, in this embodiment, the common electrode 21 is formed on approximately the entire surface of the opposite substrate 20. In addition, at the surface of the opposite substrate 20 which faces the element substrate 10, a light-shielding layer 108 is formed in a lower layer of the common electrode 21. In this embodiment, the light-shielding layer 108 is formed with a frame shape extending the outer circumference of the image display region 10a and thus serves as a break line. Here, the outer circumference of the light-shielding layer 108 is at a location separated from the gap with the inner circumference of the sealant 107, and so the light-shielding layer 108 and the sealant 107 do not overlap. Moreover, in regard to the opposite substrate 20, the light-shielding layer 108 may be formed as a black matrix portion at a region overlapping with an inter-pixel region interposed between adjacent pixel electrodes 9a or the like.

In the liquid crystal panel 100p configured as above, at the element substrate 10, an inter-substrate connecting electrode 109 for the electric connection between the element substrate 10 and the opposite substrate 20 is formed in a region overlapping with each part of the opposite substrate 20 at an outer side than the sealant 107. Since an inter-substrate connection material 109a containing conductive particles is disposed at the inter-substrate connecting electrode 109, the common electrode 21 of the opposite substrate 20 is electrically connected to the element substrate 10 through the inter-substrate connection material 109a and the inter-substrate connecting electrode 109. For this reason, a common potential Vcom is applied to the common electrode 21 from a side of the element substrate 10. The sealant 107 is installed along the outer circumference of the opposite substrate 20 with substantially the same width value. For this reason, the sealant 107 has an approximately rectangular shape. However, since the sealant 107 is installed to avoid the inter-substrate connecting electrode 109 and pass through the inside in the region overlapping with each part of the opposite substrate 20, each part of the sealant 107 has an approximately arc shape.

In the liquid crystal device 100 configured as above, if the pixel electrode 9a and the common electrode 21 are made using a translucent conductive film such as ITO (Indium Tin Oxide) or IZO (Indium Zinc Oxide), the transmission-type liquid crystal device may be configured. In this embodiment, the liquid crystal device 100 is a transmission type, and in the element substrate 10 and the opposite substrate 20, the light incident from a substrate at one side is transmitted through a substrate at the other side and is modulated while being output, thereby displaying an image.

The liquid crystal device 100 may be used as a color display device of an electronic apparatus such as mobile computers and cellular phones, and in this case, a color filter (not shown) or a protection film is formed at the opposite substrate 20. In addition, the liquid crystal device 100 responds differently depending on the kind of the liquid crystal layer 50 or according to a normal white mode/normal black mode, and a phase difference film, a polarization plate or the like is disposed at the liquid crystal panel 100p in a predetermined direction. Further, the liquid crystal device 100 may be used as an RGB light valve of a projection-type display device (liquid crystal projector), described later. In this case, since light of each color decomposed through an RGB color-decomposing dichroic mirror is incident to each of the liquid crystal device 100 for RGB as a projection light, a color filter is not formed.

In this embodiment, the description will be focused on the case where the liquid crystal device 100 is a transmission-type liquid crystal device used as an RGB light valve of a projection-type display device, described later, and the light incident from the opposite substrate 20 is output through the element substrate 10. In addition, in this embodiment, the liquid crystal device 100 will be described focusing on the case where the liquid crystal panel 100p of a VA mode using a nematic liquid crystal compound in which the dielectric anisotropy is negative is provided as the liquid crystal layer 50.

Detailed Configuration of the Pixel

Figure 3A:
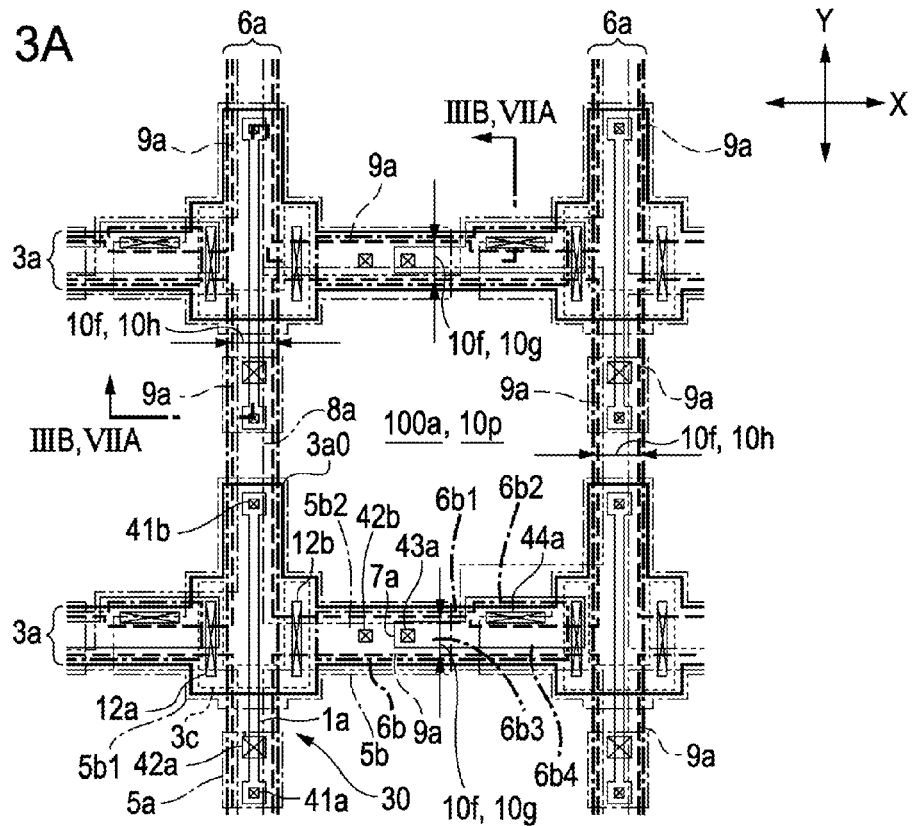
FIGS. 3A and 3B are diagrams showing a pixel of the liquid crystal device according to a first embodiment of the invention.
Figure 3B:
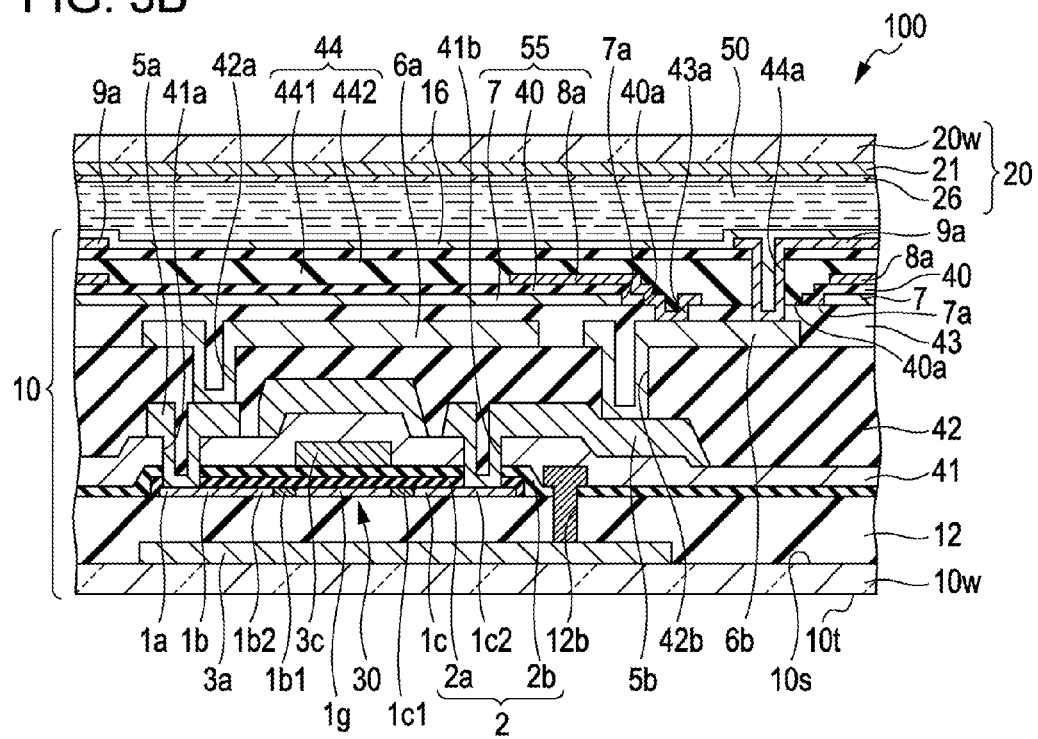
Figure 4:
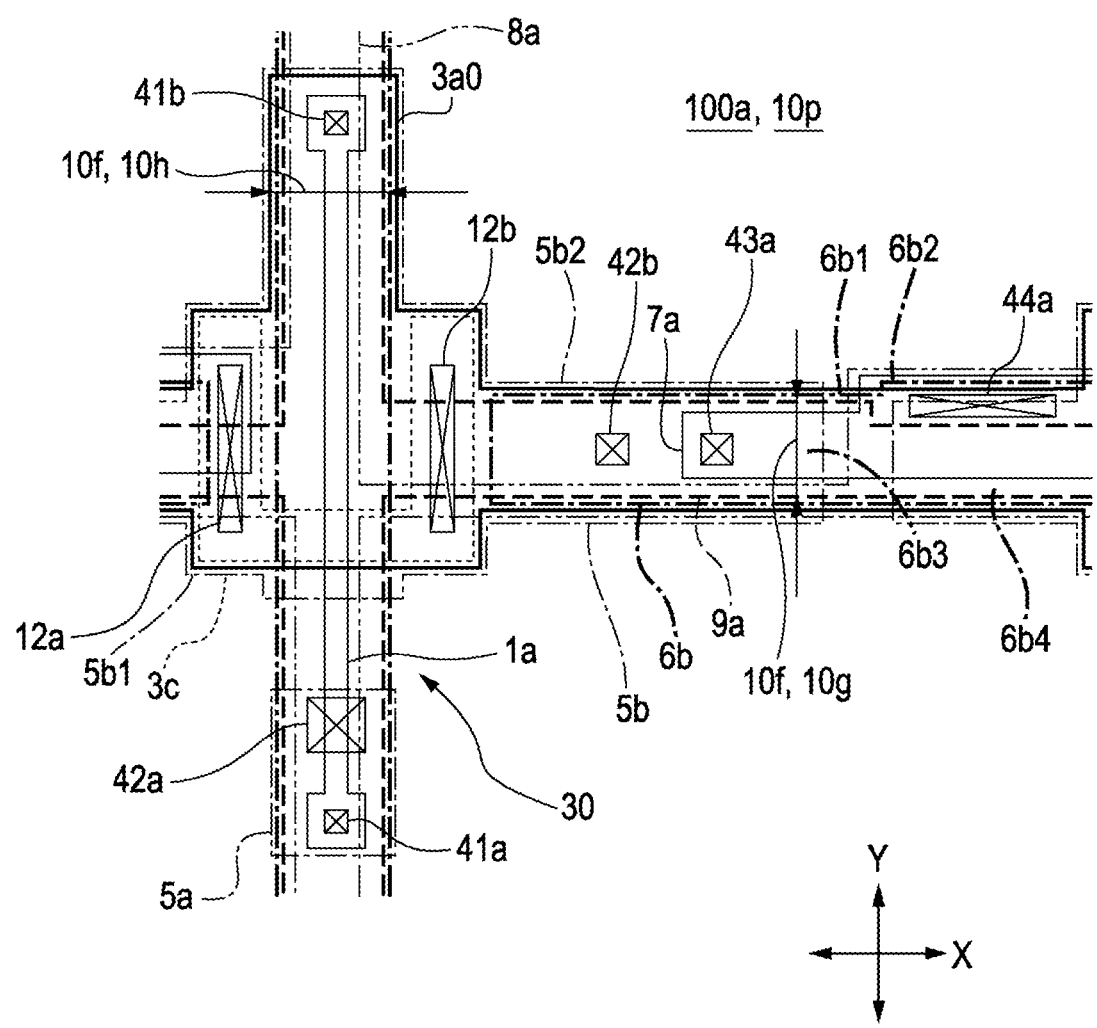
FIG. 4 is a diagram showing an enlarged view around a pixel transistor of the liquid crystal device according to the first embodiment of the invention.
Figure 5A:
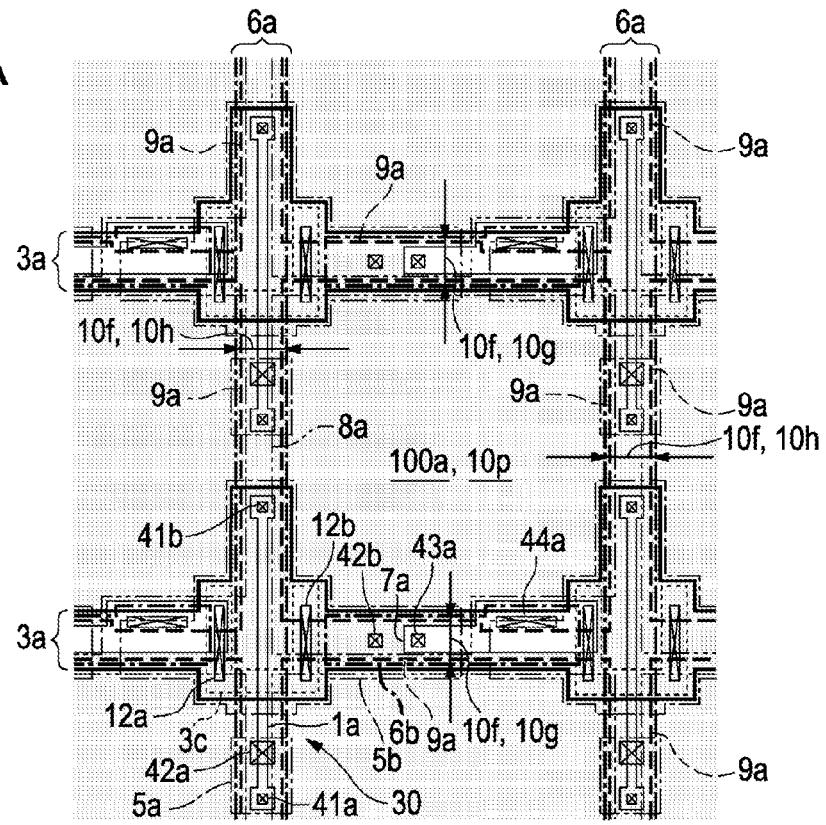
FIGS. 5A and 5B diagrams showing a formation region of an electrode layer configuring a storage capacitor of the liquid crystal device according to the first embodiment of the invention.
Figure 5B:
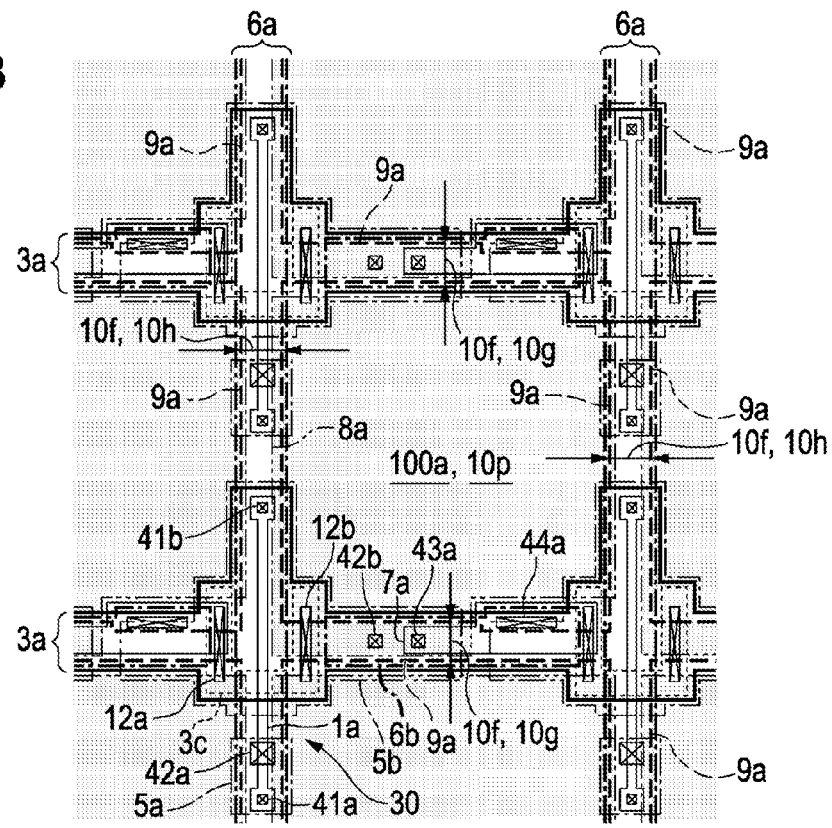

FIGS. 3A and 3B are diagrams showing a pixel of the liquid crystal device 100 according to the first embodiment of the invention, and FIGS. 3A and 3B are respectively a plane view showing a plurality of pixels adjacent to each other in regard to the element substrate 10 and a cross-sectional view when the liquid crystal device 100 is cut at a location corresponding to the IIIB-IIIB line of FIG. 3A. FIG. 4 is a diagram showing an enlarged view around a pixel transistor 30 of the liquid crystal device 100 according to the first embodiment of the invention. FIGS. 5A and 5B diagrams showing a formation region of an electrode layer configuring a storage capacitor 55 of the liquid crystal device 100 according to the first embodiment of the invention, and FIGS. 5A and 5B are respectively a diagram showing a formation region of the first electrode layer 7 as a gray region and a diagram showing a formation region of the second electrode layer 8a as a gray region.

In addition, in FIGS. 3A, 4, 5A and 5B, the line of each region is depicted as follows:

the scanning line 3a=thick solid line the semiconductor layer 1a=thin solid line the gate electrode 3c=dotted line the source electrode 5a and the drain electrode 5b (second relay electrode)=thin dashed-dotted line the data line 6a and the relay electrode 6b (first relay electrode)=thin dashed-dotted dotted line the second electrode layer 8a=dashed-two dotted line the pixel electrode 9a=thick broken line the opening 7a and the contact hole 42a of the first electrode layer 7=thin solid line In addition, since the dielectric layer 40 is formed at substantially the same region as the first electrode layer 7, it is not depicted in FIGS. 3A, 4, 5A and 5B. In addition, in FIGS. 3A, 4, 5A and 5B, even in a case where the ends of some components overlap in a plane view, their locations are changed for better recognition.

As shown in FIGS. 3A, 4, 5A and 5B, in the element substrate 10, a rectangular pixel electrode 9a is formed at each of a plurality of pixels 100a, a data line 6a and a scanning line 3a are formed along the region overlapping with the horizontal and vertical inter-pixel regions 10f interposed between adjacent pixel electrodes 9a (the span between adjacent pixel electrodes 9a). In more detail, the scanning line 3a extends along the region overlapping with a first inter-pixel region 10g extending in the X direction (first direction), among the inter-pixel regions 10f, and the data line 6a extends along the region overlapping with a second inter-pixel region 10h extending in the Y direction (second direction). Since the data line 6a and the scanning line 3a are respectively elongated linearly, pixel transistors 30 are formed corresponding to intersection between the data line 6a and the scanning line 3a.

Here, the data line 6a and the scanning line 3a are formed with a light-blocking conductive film and thus serve as a light-shielding layer. In addition, the light-shielding layer composed of the data line 6a and the scanning line 3a overlaps with the outer circumferential end of the pixel electrode 9a. Therefore, in this embodiment, in the region where the pixel electrode 9a is formed, the region surrounded by the light-shielding layer composed of the data line 6a and the scanning line 3a is a translucent region 10p where a display light is output.

Cross-Sectional Configuration of the Pixel

As shown in FIGS. 3A, 3B, 4, 5A and 5B, the element substrate 10 generally includes a translucent substrate body 10w of a quartz substrate or a glass substrate, a translucent pixel electrode 9a formed on the surface of the substrate body 10w at the liquid crystal layer 50 side (at one surface 10s side), a pixel transistor 30 for switching pixels, and a translucent orientation film 16. The opposite substrate 20 generally includes a translucent substrate body 20w of a quartz substrate or a glass substrate, a translucent common electrode 21 formed on the surface thereof at the liquid crystal layer 50 (at a surface side opposite to the element substrate 10), and a translucent orientation film 26.

In the element substrate 10, a scanning line 3a made of a conductive film such as a conductive poly-silicon film, a metal silicide film, a metallic film or a metallic film compound is formed at one surface 10s side of the substrate body 10w, and the scanning line 3a extends along the region overlapping with the first inter-pixel region 10g extending in the X direction (first direction), among the inter-pixel region 10f. In addition, the scanning line 3a has a protruding portion 3a0 protruding in the Y direction (second direction). In this embodiment, the scanning line 3a is made of a light-blocking conductive film such as tungsten silicide (WSix) and thus serves as a light-blocking film of the pixel transistor 30. In this embodiment, the scanning line 3a is made of tungsten silicide with a thickness of about 200 nm. Moreover, an insulating film such as a silicon oxide film may be installed between the substrate body 10w and the scanning line 3a.

At one surface 10s side of the substrate body 10w, an insulating film 12 such as a silicon oxide film is formed at the upper layer side of the scanning line 3a, and the pixel transistor 30 having a semiconductor layer 1a is formed at the surface of the insulating film 12. In this embodiment, the insulating film 12 has, for example, a two-layered structure having a silicon oxide film formed by a decompressed CVD method using tetraethoxysilane (Si(OC2H5)4) or a plasma CVD method using tetraethoxysilane and oxygen gas, and a silicon oxide film (HTO (High Temperature Oxide) film) formed by a high temperature CVD method.

The pixel transistor 30 includes a semiconductor layer 1a formed toward the longitudinal direction in the extending direction of the data line 6a at the intersection region between the scanning line 3a and the data line 6a, and a gate electrode 3c extending in a direction orthogonal to the length direction of the semiconductor layer 1a and overlapping with an approximately central portion of the semiconductor layer 1a in the length direction. In addition, the pixel transistor 30 has a translucent gate insulating layer 2 between the semiconductor layer 1a and the gate electrode 3c. The semiconductor layer 1a has a channel region 1g opposite to the gate electrode 3c through the gate insulating layer 2, and a source region 1b and a drain region 1c provided at both sides of the channel region 1g. In this embodiment, the pixel transistor 30 has a LDD structure. Therefore, the source region 1b and the drain region 1c respectively have low concentration regions 1b1 and 1c1 at both sides of the channel region 1g, and have high concentration regions 1b2 and 1c2 at a region adjacent to the low concentration regions 1b1 and 1c1 at a side opposite to the channel region 1g.

The semiconductor layer 1a is made of a polycrystal silicon film or the like. The gate insulating layer 2 has a two-layered structure having a first gate insulating layer 2a made of a silicon oxide film obtained by thermally oxidizing the semiconductor layer 1a, and a second gate insulating layer 2b made of a silicon oxide film formed by a CVD method or the like. The gate electrode 3c is made of a conductive film such as a conductive poly-silicon film, a metal silicide film, a metallic film or a metallic film compound, and at both sides of the semiconductor layer 1a, the gate electrode 3c is connected to the scanning line 3a through contact holes 12a and 12b formed through the gate insulating layer 2 and the insulating film 12. In this embodiment, the gate electrode 3c has a two-layered structure having a conductive poly-silicon film with a film thickness of about 100 nm and a tungsten silicide film with a film thickness of about 100 nm.

In addition, in this embodiment, when the light passing through the liquid crystal device 100 is reflected by another member, for the purpose of preventing a malfunction from occurring at the pixel transistor 30 due to photo current as the reflected light is incident on the semiconductor layer 1a, the scanning line 3a is made of a light-blocking film. However, the scanning line may be formed at the upper layer of the gate insulating layer 2, and it may be partially formed as gate electrode 3c. In this case, the scanning line 3a shown in FIGS. 3A and 3B is formed for light-blocking purposes only.

A translucent interlayer insulating film 41 made of a silicon oxide film or the like is formed at the upper layer side of the gate electrode 3c, and a source electrode 5a and a drain electrode 5b (the second relay electrode) are made of the same conductive film at the upper layer of the interlayer insulating film 41. The interlayer insulating film 41 is made of, for example, a silicon oxide film formed by means of a plasma CVD method or the like using silane gas (SH4) and nitrogen monoxide (N2O).

The source electrode 5a and the drain electrode 5b is made of a conductive film such as a conductive poly-silicon film, a metal silicide film, a metallic film or a metallic film compound. In this embodiment, the source electrode 5a and the drain electrode 5b has a four-layered structure where a titanium (Ti) film with a film thickness of 20 nm, a titanium nitride (TiN) film with a film thickness of 50 nm, an aluminum (Al) film with a film thickness of 350 nm, and a TiN film with a film thickness of 150 nm are laminated in this order. The source electrode 5a is formed with a rectangular shape in the region overlapping with the second inter-pixel region 10h (the region overlapping with the data line 6a) and is connected to the source region 1b (the source drain region at the data line side) through a contact hole 41a formed through the interlayer insulating film 41 and the gate insulating layer 2.

The drain electrode 5b includes a rectangular portion 5b1 overlapping with the pixel transistor 30 in a plane view, and a strip-shaped portion 5b2 extending from the rectangular portion 5b1 along the region overlapping with the first inter-pixel region 10g. In regard to the drain electrode 5b, the rectangular portion 5b1 partially overlaps with the drain region 1c of the semiconductor layer 1a (the source drain region at the pixel electrode side) in a plane view, at the region overlapping with the second inter-pixel region 10h (the region overlapping with the data line 6a), and is thus connected to the drain region 1c through a contact hole 41b formed through the interlayer insulating film 41 and the gate insulating layer 2.

A translucent interlayer insulating film 42 made of a silicon oxide film or the like is formed at the upper layer side of the source electrode 5a and the drain electrode 5b. The interlayer insulating film 42 is made of, for example, a silicon oxide film made by means of a plasma CVD method using tetraethoxysilane and oxygen gas. In this embodiment, the surface of the interlayer insulating film 42 is flattened by means of chemical mechanical polishing.

At the upper layer side of the interlayer insulating film 42, the data line 6a and the relay electrode 6b (the first relay electrodes) are made of the same conductive film. The data line 6a and the relay electrode 6b are made of a conductive film such as a conductive poly-silicon film, a metal silicide film, a metallic film or a metallic film compound. In this embodiment, the data line 6a and the relay electrode 6b has a four-layered structure where a titanium (Ti) film with a film thickness of 20 nm, a titanium nitride (TiN) film with a film thickness of 50 nm, an aluminum (Al) film with a film thickness of 350 nm, and a TiN film with a film thickness of 150 nm are laminated in order.

The data line 6a extends along the region overlapping with the second inter-pixel region 10h extending in the Y direction (second direction) among the inter-pixel region 10f, and is connected to the source electrode 5a through a contact hole 42a formed through the interlayer insulating film 42.

The relay electrode 6b includes an extended portion 6b1 provided in the region overlapping with the first inter-pixel region 10g in a plane view and extending in the X direction, and a curved portion 6b2 bent in the Y direction from the extended portion 6b1. In addition, the relay electrode 6b includes an overlapping portion 6b3 provided in the region overlapping with the first inter-pixel region 10g in a plane view and extending in the X direction to overlap with the drain electrode 5b in a plane view, and a protruding portion 6b4 protruding in the X direction from the end portion of the drain electrode 5b so that the extended portion 6b1 is configured with the overlapping portion 6b3 and a part of the protruding portion 6b4. In addition, a part of the protruding portion 6b4 is bent in the Y direction to configure the curved portion 6b2. Here, in the interlayer insulating film 42, a contact hole 42b is formed at a location overlapping with the overlapping portion 6b3, and the relay electrode 6b is connected to the drain electrode 5b through the contact hole 42b.

A translucent interlayer insulating film 43 made of a silicon oxide film or the like is formed at the upper layer side of the data line 6a and the relay electrode 6b. The interlayer insulating film 43 is made of, for example, a silicon oxide film or the like formed by a plasma CVD method or the like using tetraethoxysilane and oxygen gas. In this embodiment, the surface of the interlayer insulating film 43 is flattened by chemical and mechanical polishing or the like.

Configuration of the Storage Capacitor 55

At the upper layer side of the interlayer insulating film 42, a first electrode layer 7 made of a translucent conductive film such as an ITO film or an IZO film, and in this embodiment, the first electrode layer 7 is made of an ITO film. The first electrode layer 7 is a capacitor electrode for configuring the storage capacitor 55. In more detail, the first electrode layer 7 is a capacitor electrode to which a common potential Vcom is applied, between a pair of capacitor electrodes configuring the storage capacitor 55, and is configured to overlap a plurality of pixel electrodes 9a. In this embodiment, the first electrode layer 7 is integrally formed over the entire image display region 10a (the pixel arrangement region) where a plurality of pixels 100a are arranged (the gray region in FIG. 5A). For this reason, the first electrode layer 7 is also formed at the inter-pixel region 10f. In the first electrode layer 7, an opening 7a (a non-formation region of the first electrode layer 7/a decolorized region of FIG. 5A) is installed in the region overlapping with the first inter-pixel region 10g, and the opening 7a is used for connecting the second electrode layer 8a or the pixel electrode 9a to the relay electrode 6b at the lower layer side.

A translucent dielectric layer 40 is laminated at the upper layer of the first electrode layer 7. As the dielectric layer 40, a silicon compound such as a silicon nitride film as well as a high dielectric layer such as an aluminum oxide film, a titanium oxide film, a tantalum oxide film, a niobium oxide film, a hafnium oxide film, a lanthanum oxide film, a zirconium oxide film or the like may be used. Even though the dielectric layer 40 is formed at the equivalent, substantially entire, surface of the first electrode layer 7, similar to the opening 7a of the first electrode layer 7, an opening 40a is installed at a portion connecting the second electrode layer 8a or the pixel electrode 9a to the relay electrode 6b at the lower layer side.

At the upper layer of the dielectric layer 40, a second electrode layer 8a made of a translucent conductive film such as an ITO film or an IZO film is laminated, and in this embodiment, the second electrode layer 8a is made of an ITO film. The second electrode layer 8a overlaps with the first electrode layer 7 through the dielectric layer 40 to configure a storage capacitor 55 together with the first electrode layer 7 and the dielectric layer 40. The second electrode layer 8a overlaps with the extended portion 6b1 of the relay electrode 6b in regard to the first inter-pixel region 10g to be located within the opening 7a of the first electrode layer 7 and the opening 40a of the dielectric layer 40, and is connected to the extended portion 6b1 of the relay electrode 6b through a contact hole 43a (first contact hole) formed in the interlayer insulating film 43. In addition, the second electrode layer 8a is connected to an overlapping portion 6b3 of the relay electrode 6b through the contact hole 43a (first contact hole), in the extended portion 6b1.

In this embodiment, the second electrode layer 8a is formed in the region approximately overlapping with the pixel electrode 9a and is electrically connected to the pixel electrode 9a in a one-to-one relation through the relay electrode 6b (the gray region in FIG. 5B). Therefore, in the second electrode layer 8a, since the region overlapping with the inter-pixel region 10f interposed between adjacent pixel electrodes 9a becomes a non-formation region (the decolorized region in FIG. 5B), the first conductive layer 7 is located at the lower layer side of the dielectric layer 40 in the region overlapping with the non-formation region.

Configuration of the Interlayer Insulating Film 44 and the Pixel Electrode 9a

A translucent interlayer insulating film 44 is formed at the upper layer side of the second electrode layer 8a, and at the upper layer side of the interlayer insulating film 44, the pixel electrode 9a made of a translucent conductive film such as an ITO film or an IZO film is formed to have an approximately rectangular planar shape. The pixel electrode 9a overlaps with the curved portion 6b2 of the relay electrode 6b near the first inter-pixel region 10g, and the pixel electrode 9a is located within the opening 7a of the first electrode layer 7 and the opening 40a of the dielectric layer 40 and is connected to the protruding portion 6b4 of the relay electrode 6b through a contact hole 44a (second contact hole) formed in the interlayer insulating film 44. In addition, the pixel electrode 9a is connected to the curved portion 6b2 among the protruding portion 6b4 of the relay electrode 6b through the contact hole 44a (second contact hole). In this configuration, the second electrode layer 8a and the pixel electrode 9a are electrically connected through the relay electrode 6b and are electrically connected to the drain region 1c of the pixel transistor 30 through the relay electrode 6b and the drain electrode 5b.

In this embodiment, the interlayer insulating film 44 has a two-layered structure having a silicon oxide film 441 formed by a plasma CVD method using tetraethoxysilane and oxygen gas, and a doped silicate glass film 442 formed at the upper layer side of the silicon oxide film 441 by a normal temperature CVD, and the doped silicate glass film 442 is a silicate glass doped with at least one of phosphorus and boron. In the doped silicate glass film 442, the gas used in the case where a phosphorus-doped silicate glass (PSG film) is formed is SiH4, PH3, O3 or the like. The gas used in the case where a boron-doped silicate glass (BSG film) is formed is SiH4, B2H6, O3 or the like, and the gas used in the case where a boron•phosphorus-doped silicate glass film (BPSG film) is formed is SiH4, B2H6, PH3, O3 or the like. Therefore, the pixel electrode 9a is formed on the surface of the doped silicate glass film 442. In addition, in the inter-pixel region 10f interposed between adjacent pixel electrodes 9a, the doped silicate glass film 442 exposes from the pixel electrode 9a and contacts the orientation film 16. In addition, since the surface of the doped silicate glass film 442 has a flat side by means of polishing, the pixel electrode 9a is formed on the flat side. In the polishing, chemical and mechanical polishing may be used, and in the chemical and mechanical polishing, a flat polished surface may be obtained fast by means of the reaction of chemical components included in the polishing agent and the relative movement between the polishing agent and the element substrate 10. In more detail, in a polishing device, the polishing is performed while rotating a holder which retains the element substrate 10 and a surface plate to which a polishing cloth (pad) made of a non-woven fabric, foamed polyurethane, porous fluorine resin or the like is attached. At this time, for example, a polishing agent containing cerium oxide or colloidal silica with an average diameter of 0.01 to 20 μm, acrylic acid ester derivative serving as a dispersing agent, and water is supplied between the polishing cloth and the element substrate 10.

An orientation film 16 is formed on the surface of the pixel electrode 9a. The orientation film 16 is made of a resin film such as polyimide, or an oblique deposition film such as a silicon oxide film. In this embodiment, the orientation film 16 is an inorganic orientation film (vertical orientation film) made of an oblique deposition film such as SiOx (x<2), SiO2, TiO2, MgO, Al2O3, In2O3, Sb2O3, Ta2O5 or the like.

Configuration of the Opposite Substrate 20 Side

In the opposite substrate 20, at the surface of the translucent substrate body 20w such as a quartz substrate or a glass substrate at the liquid crystal layer 50 side (the surface at a side opposite to the element substrate 10), the common electrode 21 made of a translucent conductive film such as an ITO film is formed, and the orientation film 26 is formed to hide the common electrode 21. The orientation film 26 is made of an oblique deposition film such as a resin film such as polyimide or a silicon oxide film, similar to the orientation film 16. In this embodiment, the orientation film 26 is an inorganic orientation film (vertical orientation film) made of an oblique deposition film such as SiOx (x<2), SiO2, TiO2, MgO, Al2O3, In2O3, Sb2O3, Ta2O5 or the like. The orientation films 16 and 26 make the dielectric anisotropy using the liquid crystal layer 50 vertically orient the negative nematic liquid crystal compound, and the liquid crystal panel 100p is operated in a normal black VA mode.

Moreover, the data line driving circuit 101 and the scanning line driving circuit 104 described with reference to FIGS. 1, 2A and 2B is provided with a complementary transistor circuit having an n-channel type driving transistor and a p-channel type driving transistor. Here, driving transistor is formed by using a part of the manufacturing process of the pixel transistor 30. For this reason, the region of the element substrate 10 where the data line driving circuit 101 and the scanning line driving circuit 104 are formed has substantially the same cross-sectional configuration as the cross-sectional configuration shown in FIG. 3B.

Main Effects of this Embodiment

Figure 6:
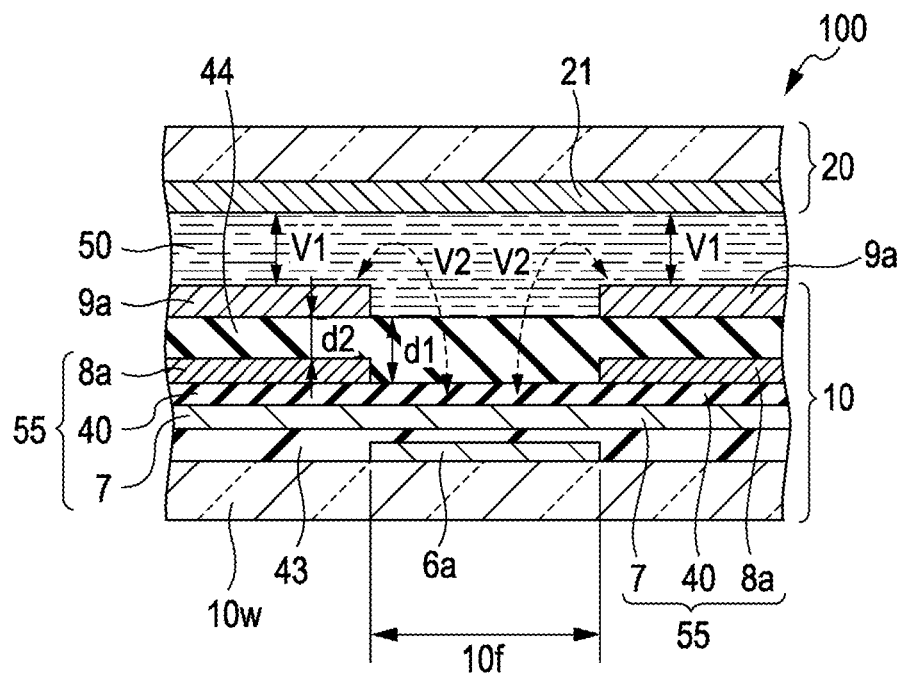
FIG. 6 is a diagram schematically showing cross-sectional location relations of each electrode used for the storage capacitor or the like of the liquid crystal device according to the first embodiment of the invention.

FIG. 6 is a diagram schematically showing cross-sectional location relations of each electrode used in the storage capacitor 55 or the like of the liquid crystal device 100 according to the first embodiment of the invention.

In the liquid crystal device 100 of this embodiment, as schematically shown in FIG. 6, the storage capacitor 55 includes a translucent first electrode layer 7, a translucent dielectric layer 40, and a translucent second electrode layer 8a. For this reason, even though the formation region of the storage capacitor 55 is spread to increase the capacity of the storage capacitor 55, the output light quantity of the display light is not disturbed. In particular, in this embodiment, at the substrate body 10w, in the region overlapping with the inter-pixel region 10f interposed between adjacent pixel electrodes 9a in a plane view, the data line 6a and scanning line 3a is installed as a light-shielding layer, and so only the translucent region 10p surrounded by the light-shielding layer is a region allowing transmission of the display light. However in this embodiment, in order to configure the storage capacitor 55 by means of the translucent first electrode layer 7, the translucent dielectric layer 40, and the translucent second electrode layer 8a, even though the formation region of the storage capacitor 55 is spread up to the translucent region to increase capacity of the storage capacitor 55, the output light quantity of the display light is not disturbed.

In addition, since this embodiment uses three translucent electrodes (the pixel electrode 9a, the first electrode layer 7 and the second electrode layer 8a), the translucent interlayer insulating film 44 may be provided between the storage capacitor 55 and the pixel electrode 9a. Therefore, as described later, even in the case where the first electrode layer 7 is present in the region overlapping the space between adjacent pixel electrodes 9a (the inter-pixel region 10f) in a plane view, since at least the interlayer insulating film 44 is interposed between the first electrode layer 7 and the pixel electrode 9a, the potential distribution is not disarrayed near the end portion of the pixel electrode 9a, and thus the orientation of liquid crystal molecules may be suitably controlled even at the end portion of the pixel electrode 9a.

In more detail, in this embodiment, since the first electrode layer 7 configuring the storage capacitor 55 is installed to overlap a plurality of pixel electrodes 9a in a plane view, the first electrode layer 7 is formed in the region overlapping with the pixel electrode 9a and in the region overlapping with the inter-pixel region 10f interposed between adjacent pixel electrodes 9a. In this aspect, since the second electrode layer 8a is electrically connected to the pixel electrode 9a in a one-to-one relationship, a non-formation region is formed in the region overlapping with the inter-pixel region 10f. For this reason, in the region overlapping the space interposed between adjacent second electrode layers 8a (the inter-pixel region 10f interposed between adjacent pixel electrodes 9a), the first conductive layer 7 is located at the lower layer side of the dielectric layer 40. In addition, a common potential Vcom is applied to the first electrode layer 7, similar to the common electrode 21 at the opposite substrate 20 side.

Here, in the liquid crystal device 100, the orientation of liquid crystal molecules of the liquid crystal layer 50 is controlled by a vertical electric field (the electric field depicted by the arrow V1) formed between the pixel electrode 9a at the element substrate 10 and the common electrode 21 to which a common potential Vcom is applied in regard to the opposite substrate 20, thereby performing light modulation to every pixel. At this time, since the common potential Vcom is applied to the first electrode layer 7, an unnecessary electric field (the electric field depicted by the arrow V2) tends to be generated between the end portion of the pixel electrode 9a and the first electrode layer 7, but in this embodiment, the interlayer insulating film 44 is interposed between the first electrode layer 7 and the pixel electrode 9a. Therefore, according to this embodiment, since an unnecessary electric field depicted by the arrow V2 is not generated, the potential distribution is not disarrayed near the end portion of the pixel electrode 9a, and the orientation of liquid crystal molecules may be controlled very suitably even for the end portion of the pixel electrode 9a.

In addition, in this embodiment, the second electrode layer 8a is installed to the dielectric layer 40 at a side where the pixel electrode 9a is located, and the first electrode layer 7 is installed to the dielectric layer 40 at a side where the substrate body 10w is located. For this reason, the interlayer insulating film 44 is interposed and the dielectric layer 40 is located between the pixel electrode 9a and the first electrode layer 7. Therefore, according to this embodiment, it is possible to securely prevent an unnecessary electric field depicted by the arrow V1 from being generated.

In addition, in this embodiment, the second electrode layer 8a is installed to the dielectric layer 40 at a side where the pixel electrode 9a is located, and the first electrode layer 7 is installed to the dielectric layer 40 at a side where the substrate body 10w is located. For this reason, in the first electrode layer 7, the pixel electrode 9a and the second electrode layer 8a to which a pixel potential is applied are present only at one surface side, and at the substrate body 10w side (the lower portion) of the first electrode layer 7, the pixel electrode 9a and the second electrode layer 8a to which a pixel potential is applied are not present. Therefore, in the data line 6a, an unnecessary capacity is not parasitic between the pixel electrode 9a of the pixel 100a and the second electrode layer 8a. In addition, the data line 6a does not receive a potential influence by the pixel electrode 9a and the second electrode layer 8a in an off-state, among its corresponding pixels 100a. Therefore, since driving loss does not occur, it is possible to reduce power consumption. In particular, in this embodiment, even though only the interlayer insulating film 43 is interposed between the storage capacitor 55 and the data line 6a, since the first electrode layer 7 is interposed between the data line 6a and the pixel electrode 9a and the second electrode layer 8a, the electric influence on the data line 6a is small.

In addition, in the liquid crystal device 100 of this embodiment, since the interlayer insulating film 44 is interposed between the second electrode layer 8a and the pixel electrode 9a, the base where the pixel electrode 9a is formed (the surface of the interlayer insulating film 44) may be polished into a flat side. For this reason, the pixel electrode 9a may be formed on the flat side. In addition, since the surface of the interlayer insulating film 44 is flattened by polishing, the thickness d1 of the interlayer insulating film 44 in the region overlapping the space between adjacent second electrode layers 8a increases in comparison to the thickness d2 of the interlayer insulating film 44 in the region overlapping with the second electrode layer 8a as much as the thickness part of the second electrode layer 8a. Therefore, in a portion located between adjacent second electrode layers 8a, since the thick interlayer insulating film 44 is present at the upper layer side of the first electrode layer 7, it is possible to securely prevent an unnecessary electric field depicted by the arrow V1 from being generated, and so orientation of liquid crystal molecules may be controlled very suitably even at the end portion of the pixel electrode 9a.

In addition, in regard to the first electrode layer 7, since the opening 7a is formed in the region overlapping with the first inter-pixel region 10g, in the region overlapping with the opening 7a, the relay electrode 6b (first relay electrode) for electrically connecting the pixel electrode 9a and the second electrode layer 8a to each other is installed. For this reason, even in the case where the first electrode layer 7 is formed over a wide range, electric connection may be made to the pixel electrode 9a. In addition, since the opening 7a formed in the region overlapping with the first inter-pixel region 10g is used, electric connection may be made to the pixel electrode 9a without greatly reducing the region where the display light may be output.

In addition, the contact hole 43a (first contact hole) for electrically connecting the relay electrode 6b and the second electrode layer 8a is installed in the region overlapping with the extended portion 6b1 of the relay electrode 6b, and the contact hole 44a (second contact hole) for electrically connecting the relay electrode 6b and the pixel electrode 9a is installed in the region overlapping with the curved portion 6b2 of the relay electrode 6b. In this embodiment as described above, since the relay electrode 6b formed in the region overlapping with the first inter-pixel region 10g is used, electric connection may be made to the pixel electrode 9a without greatly reducing the region where the display light may be output. In addition, in order to made electric connection between the drain electrode 5b and the relay electrode 6b by using the region overlapping with the first inter-pixel region 10g, electric connection may be made between the drain electrode 5b and the relay electrode 6b without greatly reducing the region where the display light may be output.

In addition, in this embodiment, the upper layer side of the interlayer insulating film 44 is a doped silicate glass film 442 doped with at least one of phosphorus and boron, and the silicate glass is porous and has a hygroscopic property. In addition, among the doped silicate glass film 442, the portion formed in the region overlapping with the inter-pixel region 10f is exposed from the pixel electrode 9a and contacts the orientation film 16. For this reason, in the case where moisture is mixed into the liquid crystal layer 50 installed at the upper layer side of the pixel electrode 9a, the doped silicate glass film 442 removes the moisture from the liquid crystal layer 50 through the orientation film 16. Therefore, the characteristics and reliability of the liquid crystal device 100 may be improved. In addition, since the doped silicate glass film 442 has a high polishing rate, the surface of the interlayer insulating film 44 (the doped silicate glass film 442) may be efficiently polished.

Second Embodiment

Figure 7A:
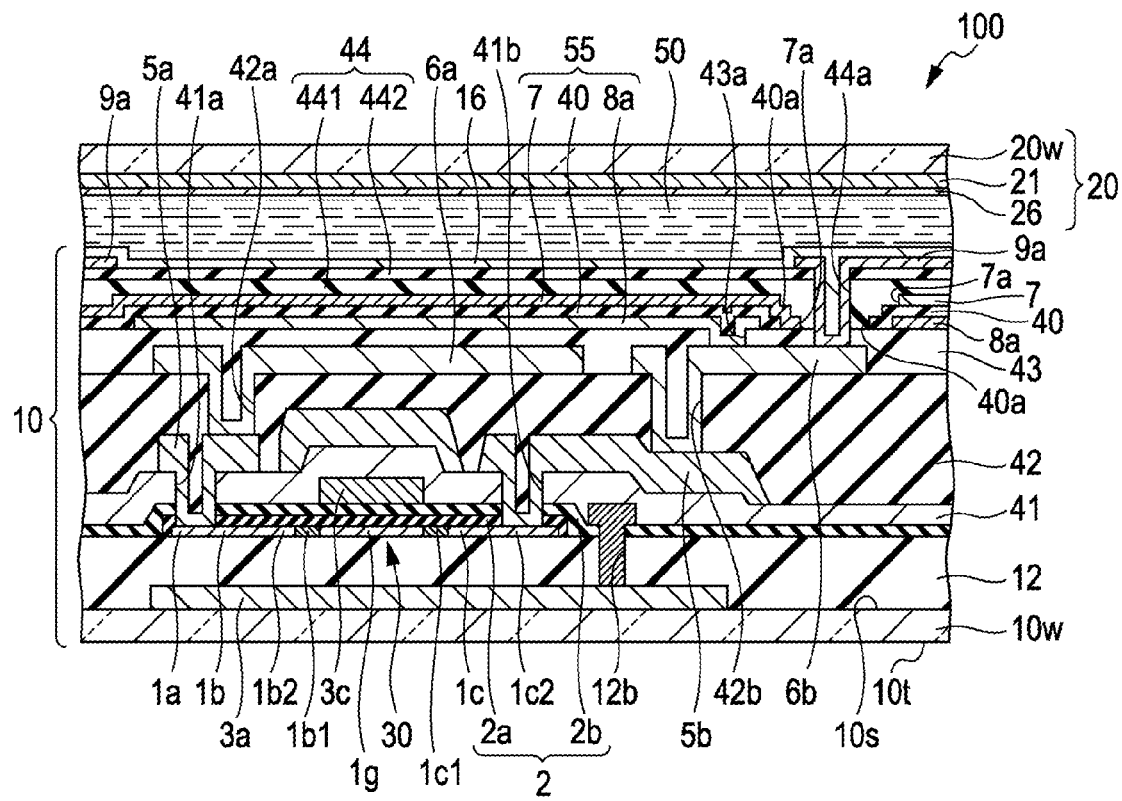
FIGS. 7A and 7B are diagrams showing a pixel of the liquid crystal device according to a second embodiment of the invention.
Figure 7B:
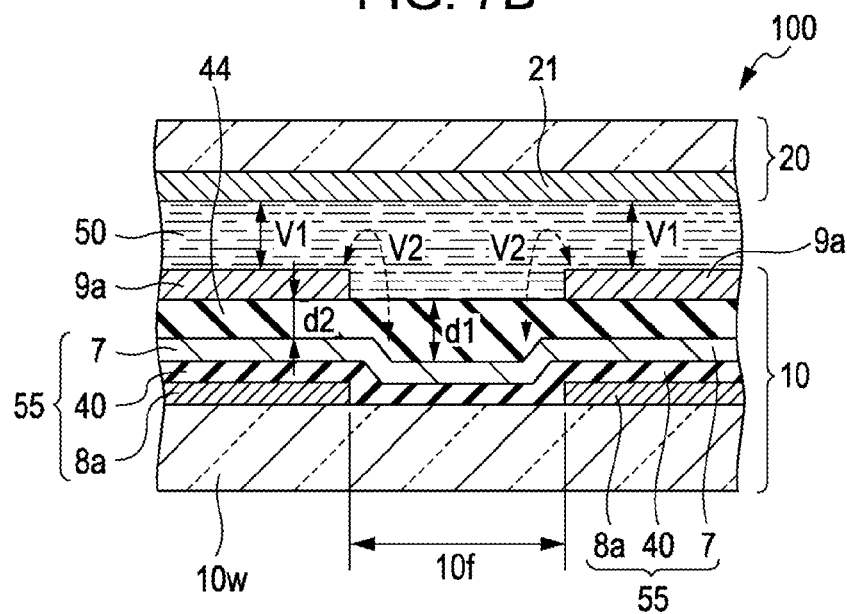

FIGS. 7A and 7B is a diagram for illustrating a pixel of a liquid crystal device 100 according to the second embodiment of the invention, and FIGS. 7A and 7B are respectively a cross-sectional view showing the liquid crystal device 100 cut at a location corresponding to the VIIA-VIIA line of FIG. 3A and a diagram schematically showing cross-sectional location relations of electrodes used for the storage capacitor 55 or the like. Moreover, since the basic configuration of this embodiment is similar to the first embodiment, common portions are given the same reference symbols and are not described in detail.

As shown in FIGS. 7A and 7B, the liquid crystal device 100 of this embodiment includes a storage capacitor 55 composed of a translucent first electrode layer 7, a translucent dielectric layer 40, and a translucent second electrode layer 8a, similar to the first embodiment. For this reason, even though the formation region of the storage capacitor 55 is spread to increase the capacity of the storage capacitor 55, the output light quantity of the display light is still not disturbed.

Here, the storage capacitor 55 is vertically inverse to the first embodiment so that the second electrode layer 8a is installed to the dielectric layer 40 at a side where the substrate body 10w is located and the first electrode layer 7 is installed to the dielectric layer 40 at a side where the pixel electrode 9a is located.

Even in this configuration, the interlayer insulating film 44 is interposed between the first electrode layer 7 and the pixel electrode 9a. Therefore, even in the case where the first electrode layer 7 is present in the region overlapping the space between adjacent pixel electrodes 9a (the inter-pixel region 10f) in a plane view, an unnecessary electric field (the electric field depicted by the arrow V2) may not be easily generated between the end portion of the pixel electrode 9a and the first electrode layer 7. Therefore, the potential distribution is not disarrayed near the end portion of the pixel electrode 9a, the orientation of liquid crystal molecules may still be suitably controlled even for the end portion of the pixel electrode 9a. In addition, the surface of the insulating film 44 interposed between the first electrode layer 7 and the pixel electrode 9a is flattened into a flat side. For this reason, the pixel electrode 9a may be formed on a flat side. In addition, since the surface of the interlayer insulating film 44 is flattened by polishing, the thickness d1 of the interlayer insulating film 44 in the region overlapping the space between adjacent second electrode layers 8a increases in comparison to the thickness d2 of the interlayer insulating film 44 in the region overlapping with the second electrode layer 8a as much as the thickness part of the second electrode layer 8a. Therefore, in a portion located between adjacent second electrode layers 8a, since the thick interlayer insulating film 44 is present at the upper layer side of the first electrode layer 7, the same effects as in the first embodiment obtained, for example securely preventing an unnecessary electric field depicted by the arrow V1 from being generated.

Other Embodiments

In addition, even though the invention has been applied to the liquid crystal device 100 in the above embodiments, the invention may also be applied to an electro-optical device such as an organic electroluminescence device, other than the liquid crystal device 100.

Configuration Example of Electronic Apparatus

Figure 8:
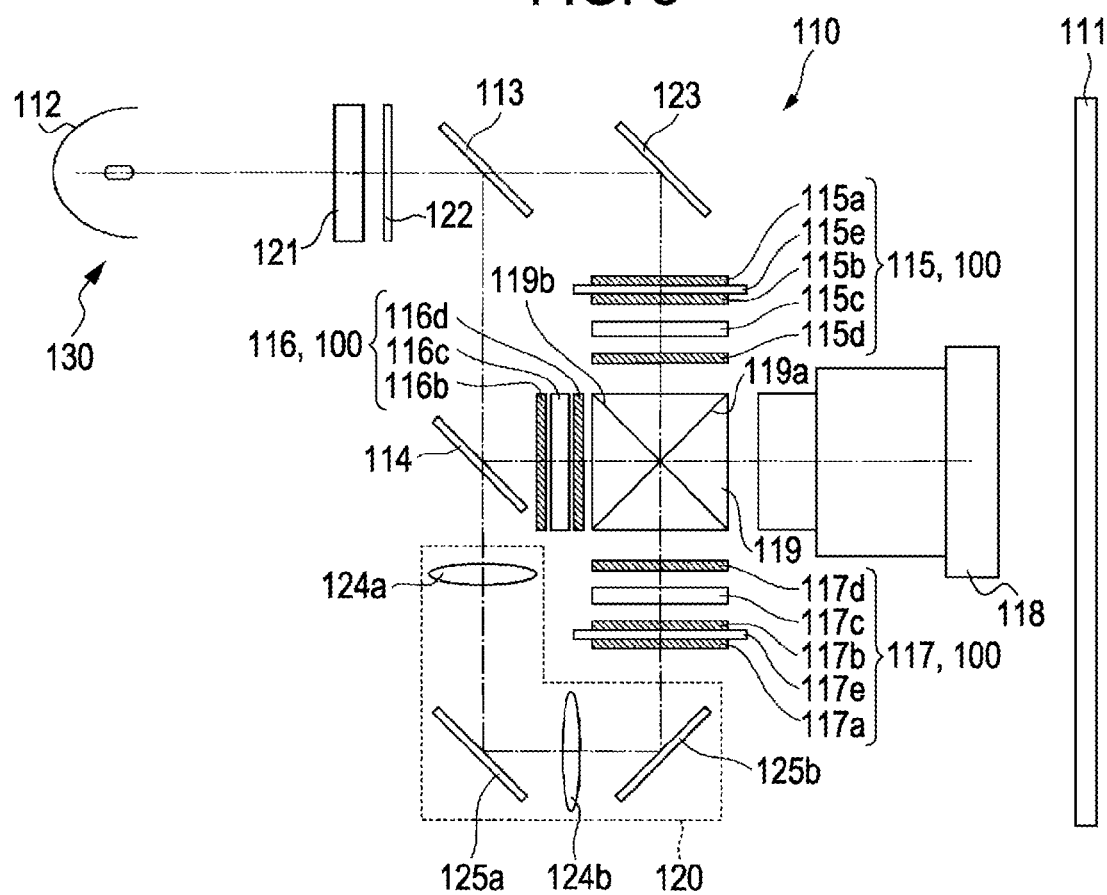
FIG. 8 is a schematic view showing a configuration of a projection-type display device using the liquid crystal device according to the invention.
Figure 9:
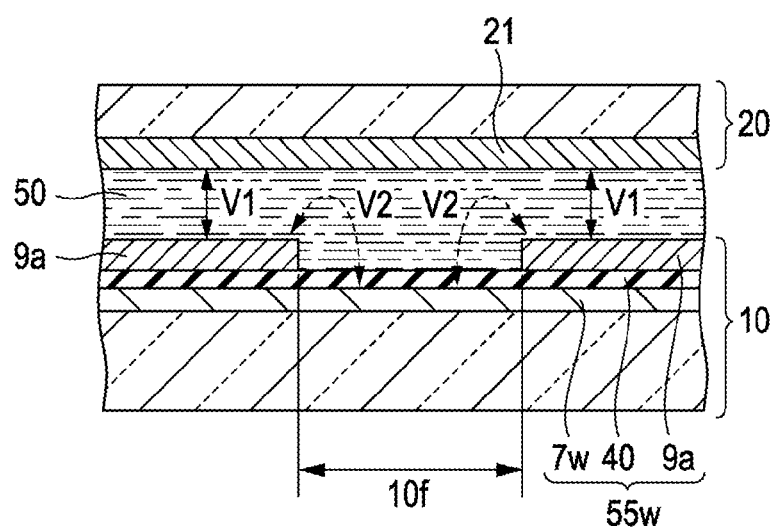
FIG. 9 is a diagram for illustrating problems of the related art.

An electronic apparatus having the liquid crystal device 100 according to the above embodiment will be described. FIG. 8 is a schematic diagram showing a projection-type display device using the liquid crystal device 100 according to the invention. The projection-type display device 110 shown in FIG. 8 is a so-called projection-type display device which irradiates light to a screen 111 at an observer side and observes the light reflected by the screen 111. The projection-type display device 110 includes a light source unit 130 having a light source 112, dichroic mirrors 113 and 114, liquid crystal light valves 115 to 117 (the liquid crystal device 100), an optical projecting system 118, a cross dichroic prism 119 and a relay system 120.

The light source 112 includes an ultra high pressure mercury lamp supplying light including red light, green light and blue light. The dichroic mirror 113 is configured to allow the red light from the light source 112 to pass and to reflect the green light and the blue light. In addition, the dichroic mirror 114 is configured to allow the blue light to pass, among the green light and blue light reflected by the dichroic mirror 113, and to reflect the green light. As described above, the dichroic mirrors 113 and 114 configures a color separating optical system which divides the light output from the light source 112 into red light, green light and blue light.

Here, between the dichroic mirror 113 and the light source 112, an integrator 121 and a polarization converting element 122 are disposed in order from the light source 112. The integrator 121 is configured to regularize the illumination distribution of the light irradiated from the light source 112. In addition, the polarization converting element 122 is configured to polarize the light from the light source 112 into, for example, a polarized light having a specific oscillating direction like the s-polarized light.

The liquid crystal light valve 115 is a transmission-type liquid crystal device 100 which modulates the red light passing through the dichroic mirror 113 and reflected by the reflective mirror 123 according to an image signal. The liquid crystal light valve 115 includes a λ/2 retardation plate 115a, a first polarization plate 115b, a liquid crystal panel 115c and a second polarization plate 115d. Here, the red light incident to the liquid crystal light valve 115 is still the s-polarized light since the polarization of the light is not changed even though passing through the dichroic mirror 113.

The λ/2 retardation plate 115a is an optical device which converts the s-polarized light incident to the liquid crystal light valve 115 into a p-polarized light. In addition, the first polarization plate 115b is a polarization plate which blocks the s-polarized light and allows the p-polarized light to pass. In addition, the liquid crystal panel 115c is configured to convert the p-polarized light into s-polarized light (circular polarized light or oval polarized light in the case of a middle tone) by means of modulation according to the image signal. Further, the second polarization plate 115d is a polarization plate which blocks the p-polarized light and allows the s-polarized light to pass. Therefore, the liquid crystal light valve 115 is configured to modulate the red light according to the image signal and to output the modulated red light toward the cross dichroic prism 119.

In addition, the λ/2 retardation plate 115a and the first polarization plate 115b are disposed to contact a translucent glass plate 115e which does not convert the polarized light in order to prevent the λ/2 retardation plate 115a and the first polarization plate 115b from being distorted by heating.

The liquid crystal light valve 116 is a transmission-type liquid crystal device 100 which modulates the green light reflected by the dichroic mirror 113 and then reflected by the dichroic mirror 114 according to the image signal. In addition, the liquid crystal light valve 116 includes a first polarization plate 116b, a liquid crystal panel 116c and a second polarization plate 116d, similar to the liquid crystal light valve 115. The green light incident to the liquid crystal light valve 116 is s-polarized light incident after being reflected by the dichroic mirrors 113 and 114. The first polarization plate 116b is a polarization plate which blocks the p-polarized light and allows the s-polarized light to pass. In addition, the liquid crystal panel 116c is configured to convert the s-polarized light into p-polarized light (circular polarized light or oval polarized light in the case of a middle tone) according to the image signal. Further, the second polarization plate 116d is a polarization plate which blocks the s-polarized light and allows the p-polarized light to pass. Therefore, the liquid crystal light valve 116 is configured to modulate the green light according to the image signal and to output the modulated green light toward the cross dichroic prism 119.

The liquid crystal light valve 117 is a transmission-type liquid crystal device 100 which modulates the blue light reflected by the dichroic mirror 113, passing through dichroic mirror 114 and then passing through the relay system 120 according to the image signal. In addition, the liquid crystal light valve 117 includes a $\lambda/2$ retardation plate 117a, a first polarization plate 117b, a liquid crystal panel 117c and a second polarization plate 117d, similar to the liquid crystal light valves 115 and 116. Here, the blue light incident to the liquid crystal light valve 117 is reflected by the dichroic mirror 113, passes through the dichroic mirror 114 and then is reflected by two reflective mirrors 125a and 125b, described later, of the relay system 120, thereby becoming s-polarized light.

The $\lambda/2$ retardation plate 117a is an optical device which converts the s-polarized light incident to the liquid crystal light valve 117 into p-polarized light. In addition, the first polarization plate 117b is a polarization plate which blocks the s-polarized light and allows the p-polarized light to pass. In addition, the liquid crystal panel 117c is configured to convert the p-polarized light into s-polarized light (circular polarized light or oval polarized light in the case of a middle tone) by means of modulation according to the image signal. Further, the second polarization plate 117d is a polarization plate which blocks the p-polarized light and allows the s-polarized light to pass. Therefore, the liquid crystal light valve 117 is configured to modulate the blue light according to the image signal and to output the modulated blue light toward the cross dichroic prism 119. Moreover, the $\lambda/2$ retardation plate 117a and the first polarization plate 117b are disposed to contact a glass plate 117e.

The relay system 120 includes relay lenses 124a and 124b and reflective mirrors 125a and 125b. The relay lenses 124a and 124b are installed to prevent a light loss caused by a long light path of the blue light. Here, the relay lens 124a is disposed between the dichroic mirror 114 and the reflective mirror 125a. In addition, the relay lens 124b is disposed between the reflective mirrors 125a and 125b. The reflective mirror 125a is disposed to reflect the blue light passing through the dichroic mirror 114 and output from the relay lens 124a to be oriented toward the relay lens 124b. In addition, the reflective mirror 125b is disposed to reflect the blue light output from the relay lens 124b to be oriented toward the liquid crystal light valve 117.

The cross dichroic prism 119 is a color synthesizing optical system where two dichroic films 119a and 119b are orthogonally arranged in an X shape. The dichroic film 119a is a film which reflects the blue light and allows the green light to pass, and the dichroic film 119b is a film which reflects the red light and allows the green light to pass. Therefore, the cross dichroic prism 119 synthesizes the red light, the green light and the blue light, respectively modulated by the liquid crystal light valve 115 to 117, to be output toward the optical projecting system 118.

In addition, the light incident from the liquid crystal light valves 115 and 117 to the cross dichroic prism 119 is s-polarized light, and the light incident from the liquid crystal light valve 116 to the cross dichroic prism 119 is p-polarized light. As described above, the light incident to the cross dichroic prism 119 has different kinds of polarized light, and the light incident from each of the liquid crystal light valve 115 to 117 may be composed by means of the cross dichroic prism 119. Here, generally, the dichroic films 119a and 119b have excellent reflective transistor characteristics of the s-polarized light. For this reason, the red light and the blue light reflected by the dichroic films 119a and 119b are s-polarized light, and the green light passing through the dichroic films 119a and 119b is p-polarized light. The optical projecting system 118 has a transparent lens (not shown) and is configured to project the light composed by the cross dichroic prism 119 to the screen 111.

Other Projection-type Display Devices

In addition, the projection-type display device may use a LED light source or the light, which outputs light of each color, as a light source unit so that the light of each color, output from the LED light source may be supplied t different liquid crystal devices.

Other Electronic Apparatuses

The liquid crystal device 100 according to the invention may be used as a direct-view display device of an electronic apparatus such as cellular phones, PDA (Personal Digital Assistants), digital cameras, liquid crystal TV, car navigation devices, picture phones, POS terminals, and various kinds of equipment having a touch panel as well as the above electronic apparatus.

This application claims priority to Japan Patent Application No. 2011-081642 filed Apr. 1, 2011, the entire disclosures of which are hereby incorporated by reference in their entireties.

What is claimed is:

1. An electro-optical device, comprising:
 a substrate;
 a translucent pixel electrode disposed over one side of the substrate;
 a transistor disposed to correspond to the pixel electrode;
 a data line disposed between the pixel electrode and the substrate, the data line being electrically connected to the transistor; and
 a storage capacitor disposed between the pixel electrode and the substrate, and in which a translucent first electrode layer overlapping with the pixel electrode in a plane view, a translucent second electrode layer electrically connected to the pixel electrode, and a translucent dielectric layer interposed between the first electrode layer and the second electrode layer are laminated,
 wherein the first electrode layer overlaps with the data line, the first electrode layer having an opening disposed so as not to overlap with the data line, the opening being completely surrounded by the first electrode layer.

2. The electro-optical device according to claim 1, further comprising:
 a first relay electrode disposed so as to overlap with the opening of the first electrode layer,
 wherein the first relay electrode is electrically connected, respectively, to the pixel electrode and the second electrode layer via a contact hole.

3. The electro-optical device according to claim 2,
 wherein the first relay electrode includes an extended portion extending in a first direction in a region overlapping the space between adjacent pixel electrodes in a plane view, and a curved portion curved from the extended portion in a second direction crossing the first direction and, wherein a first contact hole for electrically connecting the first relay electrode and the second electrode layer is disposed in a region overlapping with the extended portion, and wherein a second contact hole for electrically connecting the first relay electrode and the pixel electrode is disposed in a region overlapping with the curved portion.

4. The electro-optical device according to claim 2, further comprising:

a transistor disposed to correspond to the pixel electrode; and a second relay electrode for electrically connecting the transistor and the first relay electrode, wherein the second relay electrode is disposed to overlap with the transistor in a plane view and disposed to extend in the first direction in the region overlapping the space between adjacent pixel electrodes, wherein the first relay electrode includes, in a plane view, an overlapping portion extending in the first direction in the region overlapping the space between adjacent pixel electrodes to overlap with the second relay electrode in a plane view, and a protruding portion protruding in the first direction from the end of the second relay electrode in the region overlapping the space between adjacent pixel electrodes in a plane view, wherein the second electrode layer is electrically connected to the overlapping portion through the first contact hole, and wherein the pixel electrode is electrically connected to the protruding portion through the second contact hole.

5. The electro-optical device according to claim 1, wherein the first electrode layer is disposed on the dielectric layer at the substrate side, and wherein the second electrode layer is disposed on the dielectric layer at the pixel electrode side.

6. The electro-optical device according to claim 1, wherein the first electrode layer is disposed on the dielectric layer at the pixel electrode side, and wherein the second electrode layer is disposed on the dielectric layer at the substrate side.

7. The electro-optical device according to claim 1, wherein the surface of an interlayer insulating film disposed between the storage capacitor and the pixel electrode has a flat side.

8. The electro-optical device according to claim 1, wherein the first electrode layer is disposed at the entire surface of a pixel arrangement region where a plurality of the pixel electrodes are arranged.

9. The electro-optical device according to claim 1, wherein a light-shielding layer is disposed in the region overlapping the space between adjacent pixel electrodes in a plane view, and wherein the storage capacitor is at least disposed within the region overlapping a translucent region surrounded by the light-shielding layer in a plane view.

10. The electro-optical device according to claim 1, wherein the substrate retains the liquid crystal layer between the substrate and a translucent opposite substrate arranged to face each other at one surface side of the substrate.

11. A projection-type display device, comprising:
the electro-optical device according to claim 1;
a light source unit for outputting the illumination light radiated to the electro-optical device; and
an optical projecting system for projecting the light modulated by the electro-optical device.

12. An electronic apparatus, comprising the electro-optical device according to claim 1.

13. The electro-optical device according to claim 1, wherein the first electrode layer is integrally formed over an entire image display region where a plurality of pixels are arranged.

14. The electro-optical device according to claim 1, wherein the first electrode layer and the second electrode layer each substantially overlap a region between adjacent data lines and adjacent scanning lines.

15. The electro-optical device according to claim 2, wherein the opening is disposed over a data line.

16. An electro-optical device, comprising:
a substrate;
a pixel electrode that transmits a light;
a transistor disposed to correspond to the pixel electrode;
a data line disposed between the pixel electrode and the substrate, the data line being electrically connected to the transistor; and
a storage capacitor disposed between the pixel electrode and the substrate,
the storage capacitor including a first electrode, a second electrode, and a dielectric layer that is disposed between the first electrode and the second electrode,
the first electrode, the second electrode, and the storage capacitor transmitting light,
the first electrode overlapping with the pixel electrode in plane view, and
the second electrode being electrically connected to the pixel electrode,
wherein the first electrode layer overlaps with the data line, the first electrode layer having an opening disposed so as not to overlap with the data line, the opening being completely surrounded by the first electrode layer.

17. The electro-optical device according to claim 16, further comprising:
a first relay electrode that electrically connects the pixel electrode and the second electrode; and
a contact hole that electrically connects the first relay electrode and the pixel electrode,
the first relay electrode being disposed in an opening of the first electrode in plane view,
the first relay electrode having a first portion extending in a first direction, and a second portion that is connected to the first portion, and
the contact hole overlapping the second portion in plane view.

18. An electro-optical device, comprising:
a substrate;
a translucent pixel electrode disposed over one side of the substrate;
a data line disposed between the substrate and the pixel electrode, the data line being electrically connected to the transistor; and
an insulating film disposed between the data line and the pixel electrode; and
a storage capacitor disposed between the insulating film and the pixel electrode, in which a translucent first electrode overlaps with a central region of the pixel electrode in a plane view, a translucent second electrode electrically connected to the pixel electrode, and a translucent dielectric layer interposed between the first electrode and the second electrode are laminated,
wherein the first electrode layer overlaps with the data line, the first electrode layer having an opening disposed so as not to overlap with the data line, the opening being completely surrounded by the first electrode layer.

* * * * *